United States Patent [19]
Wolfram
[11] 3,737,787
[45] June 5, 1973

[54] ELECTRONIC SIGNAL SEEKING SYSTEM WITH RAPID SCAN

[75] Inventor: Adolf Wolfram, Portsmouth, Va.
[73] Assignee: General Electric Company, Portsmouth, Va.
[22] Filed: June 29, 1971
[21] Appl. No.: 158,015

[52] U.S. Cl. ....................325/470, 325/423, 325/422, 334/16
[51] Int. Cl. ....................H04b 1/32
[58] Field of Search ....................325/335, 418–423, 325/464, 468–470; 334/14–16, 18

[56] References Cited

UNITED STATES PATENTS

| | | | |
|---|---|---|---|
| 3,492,584 | 1/1970 | Takahashi | 325/470 X |
| 3,632,864 | 1/1972 | Evans | 325/469 X |
| 3,651,411 | 3/1972 | Zlotnick | 325/470 X |
| 3,467,870 | 9/1969 | Aoyama | 325/470 |
| 3,024,359 | 3/1962 | Birx | 325/470 |

*Primary Examiner*—Robert L. Griffin
*Assistant Examiner*—William T. Ellis
*Attorney*—Stanley C. Corwin, W. J. Shanley, F. W. Powers et al.

[57] ABSTRACT

A signal-seeking tuning control system for use with a voltage-controlled tuner. A ramp generator is operated manually to cause the tuner to sweep through a spectrum of channel frequencies. When the converted-frequency signal outputted by the tuner approaches a desired frequency range a discriminator produces an error signal for energizing a control system having three discrete states. when the discriminator output is within a fixed, narrowly defined range the control system arrests the operation of the ramp generator. Should the converted frequency drift beyond the narrow range, the discriminator produces an error signal which reflects the change in frequency, energizing an appropriate segment of the control to operate the ramp generator. Retrace means are provided for recycling the ramp generator when the voltage outputted thereby achieves a predetermined maximum or minimum value.

3 Claims, 3 Drawing Figures

INVENTOR
ADOLF E. WOLFRAM
BY James E. Espe
HIS ATTORNEY

INVENTOR
ADOLF E. WOLFRAM
BY James E Espe
HIS ATTORNEY

ELECTRONIC SIGNAL SEEKING SYSTEM WITH RAPID SCAN

BACKGROUND OF THE INVENTION

The present invention relates to tuners for television receivers and, more particularly, to means for scanning through one or more frequency ranges and for automatically maintaining the tuning of a selected frequency. In the past, most television receiver tuners have comprised electro-mechanical devices wherein tuning of a reference oscillator was achieved by mechanically switching resonant circuit elements in and out of a tuned circuit, or by mechanically changing the resonance of selected portions of a tuned circuit. Recently, however, voltage-controlled tuners have become practical, such tubers often making use of voltage-controlled capacitors known as varicaps.

The capacitance of the varicap may be varied by applying a predetermined voltage thereacross. The resulting change in capacitance may be used to modify the resonant characteristics of a tuned circuit to afford tuning by electronic, rather than by mechanical, means. It will be apparent that many approaches may be taken to provide a controlled, variable voltage to a varicap for effecting tuning control. In addition to initially providing a voltage to cause a tuber to produce a signal corresponding to a preselected received frequency, or channel, it is necessary that the voltage thus provided be controlled in order to cause the tuner to "track" variations occurring in the receiver signal due to changes in receiver components caused by age, changes in ambient temperature, etc.

Automatic frequency control as such is presently known. The voltage for achieving such control, often being derived from a discriminator, may serve to output an error voltage whose level and/or polarity is the analog of the detected difference between a desired frequency and the frequency of a signal provided by the intermediate frequency (IF) stages of the receiver.

Various means are known which are adaptable to provide a variable voltage to a voltage-controlled tuber. Switches, relays and variable resistors have all been used. However, such devices are susceptible to wear and breakage and, in the aggregate, can be relatively expensive. Further, such mechanical or electromechanical control devices ordinarily require still other switching means to adapt them for use in the various frequency bands in which commercial television channels lie. Accordingly, it would be desirable to provide a frequency scanning control for a voltage-controlled tuner, along with automatic frequency control means for maintaining accurate tuning of a predetermined channel.

It is therefore an object of the present invention to provide improved means for causing a voltage-controlled tuner to sweep through a predetermined frequency band.

It is further object of the present invention to provide band sweeping control means for a voltage-controlled tuner which automatically returns to a first end of a frequency band, after having attained the opposite end of such band.

Still another object of this invention to provide band sweeping means for use with a voltage-controlled tuber, which automatically selects an alternate frequency band after having transversed a first frequency band.

It is a still further object of the present invention to provide band sweeping means for use with a voltage-controlled tuner system which automatically locks on a selected received signal.

SUMMARY OF THE INVENTION

Briefly stated, in accordance with one embodiment of the present invention, there is provided a ramp generator for producing a continuously varying voltage which may be applied to the terminals of a voltage-controlled tuner. Control means are provided to apply a first, higher or a second, lower control voltage to the ramp generator for causing the generator output voltage to either increase or decrease. Switching means are provided to cause the ram generator output to remain constant when the voltage provided thereby has achieved a desired value and caused the tuner to select a particular channel. A frequency discriminator is provided, and is coupled to the system for producing an error signal representative of the difference between a portion of the IF signal and a desired frequency. The voltage thus produced is then applied to the control means. Depending upon the polarity of the signal produced by the discriminator, a first or second portion of the control means is energized for applying a suitable control voltage to the ramp generator. The voltage thus applied serves to correct the level of the voltage outputted by the ramp generator, thus causing the tuner to "home in" on the desired frequency.

Signal combining means are provided for receiving discriminator output signals and synchronizing signals, the signal combining means becoming operative upon reception of both synchronizing and frequency discriminator output signals to energize the aforementioned control means.

Retrace circuit means are provided which sense the voltage outputted by the ramp generator and cause the generator to be recycled to one extreme of its range upon the production of a voltage indicating achievement of the opposite extreme. Further, a band switching circuit is keyed to assume an opposite mode each time the retrace circuit becomes operative. The band switching circuit serves to alternatively energize means within the voltage-controlled tuner for allowing the tuner to receive channels of different frequency bands. In this manner, when the ramp generator has swept through a first frequency band, exhausting its range, it is recycled by the retrace circuit to sweep through a second frequency band in the same direction as the first.

In a further embodiment of the present invention, bidirectional scan circulation is achieved by providing the scan circuit with the additional capability of recycling the ramp generator when generator output voltage approaches either extreme of its range.

BRIEF DESCRIPTION OF THE DRAWINGS

While the specification concludes with claims particularly pointing out and distinctly claiming the subject matter which is regarded as the invention, it is believed that the invention will be better understood from the following description of the preferred embodiments taken in conjunction with the accompanying drawings, in which:

DESCRIPTION OF THE PREFERRED EMBODIMENTS

Figure 1:
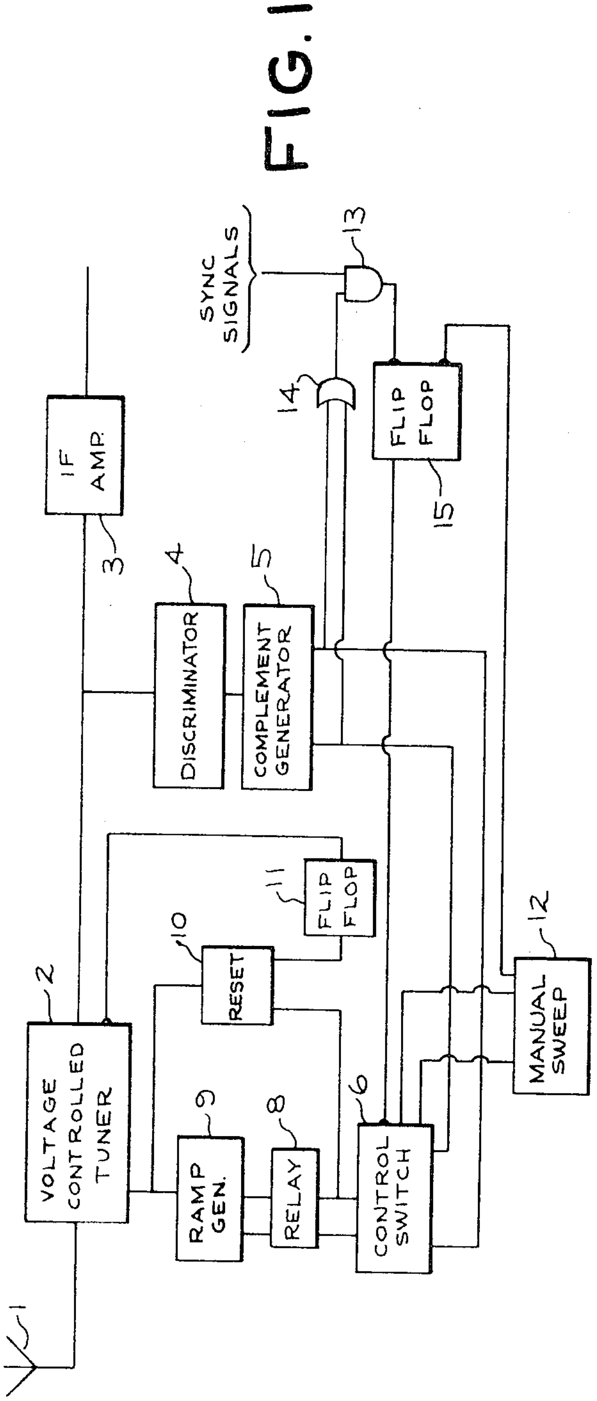
FIG. 1 is an idealized diagram of one embodiment of the invention.

FIG. 1 shows the invention in conjunction with selected portions of a conventional television receiver. Signals detected by an aerial 1 are applied to a voltage-controlled tuber 2. It is contemplated that tuber 2 may include a radio frequency (RF) amplifier, a local oscillator and a mixing or demodulating stage for outputting the usual IF signal. The IF signal is received by an IF amplifier 3 and transmitted to subsequent stages of the receiver (not shown).

A discriminator 4 is coupled to the IF signal transmission path and outputs a signal which may advantageously take the form of an error voltage whose polarity and magnitude reflect the sense and degree of excursions of the IF signal from a desired central frequency range. Complement generator 5 receives the discriminator output and provides a signal similar to that obtained from discriminator 4 at a first output terminal and a mirror-image signal, having identical magnitude but of opposite polarity, at a second output terminal. The signals thus provided are applied to the input terminals of control 6. Control 6 and an associated ramp generator 9 form a portion of the subject matter of my copending application Ser. No. 158,013, filed concurrently herewith and assigned to the assignee of the present application.

Control 6 is activated by signals from complement generator 5 and applies a first, higher or a second, lower control voltage to ramp generator 9 by means of a relay or switch 8. Control also acts to open switch 8 when automatic homing of the voltage outputted by ramp generator 9 is not desired, or when it is desired to arrest the output of ramp generator 9 at a fixed value. Ramp generator 9 accumulates or integrates the control voltages applied thereto for providing a continuously increasing or decreasing voltage. When switch 8 is open, however, the output of ramp generator 9 is arrested at its current value.

Reset 10 senses the voltage outputted by ramp generator 9 and resets the ramp generator to its lowest level after the voltage outputted by generator 9 exceeds some maximum value. Flip-flop 11 is also activated by the action of reset 10 and produces signals of alternate polarities for causing tuber 2 to select alternate frequency bands.

In order to cause the system to sweep through signal frequency bands, or from one channel to the next, or through several channels, without automatically locking on a received signal, manual sweep switch 12 is provided to override the signal-seeking action of control 6 in a manner to be described herein. FIG. 1 also shows AND gate 13 which receives sync signals derived from subsequent stages of the receiver (not shown), and a signal outputted by OR gate 14. The output of AND gate 13 sets flip-flop 15, enabling control 6. The output of AND gate 13 sets flip-flop 15, enabling control 6. A reset terminal is provided on flip-flop 15 for resetting the flip-flop in response to the actuation of manual sweep switch 12.

In operation, manual sweep switch 12 is operated to cause a first, higher or a second, lower potential to be applied to ramp generator 9. The ramp generator then produces a continuous ramp-like voltage signal which may increase or decrease, depending on the state of manual sweep switch 12. As the voltage applied by ramp generator 9 to voltage-controlled tuber 2 varies, the changing bias upon the tuner causes a voltage-controlled oscillator therewithin to scan through a range of frequencies. When a frequency is encountered which, when mixed with a signal detected by antenna 1, produces an IF signal near a desired central frequency $f_o$ the discriminator 4 is activated and outputs an error signal. The central frequency $f_o$ would, for example in a television receiver, be the picture carrier frequency 45.75 mHz, the discriminator 4 being tuned to this frequency. The error signal ordinarily comprises a positive or a negative direct voltage, depending upon whether the produced frequency is above or below the desired frequency $f_o$. Complement generator 5 applies an analogous signal to one input terminal of control 6 and applies a similar signal of opposite polarity to the other input terminal of the control. As described in my aforementioned copending application Ser. No. 158,013, the control 6 is then energized to produce a control voltage for causing the ramp generator 9 to bring the signal outputted by tuber 2 to the proper frequency $f_o$. In order to prevent a response to spurious IF signals, such as those representing the audio portion of a received signal, AND gate 13 is provided. AND gate 13 is adapted to receive both a signal indicating the presence of an IF signal outputted by OR gate 14, and sync signal such a are usually derived by a sync separator stage in a television receiver. Such sync signals are transmitted only with the video portion of a broadcast signal, so that the coincidence of sync signals and an error signal outputted by discriminator 4 indicates that the IF signal sensed by the discriminator is in fact a video signal. The output of AND gate 13 then sets flip-flop 15, which outputs a signal for enabling control 6, Subsequent operation of manual sweep switch 12 resets flip-flop 15 and overrides control 6 for causing the tuner to seek further channels.

Figure 2:
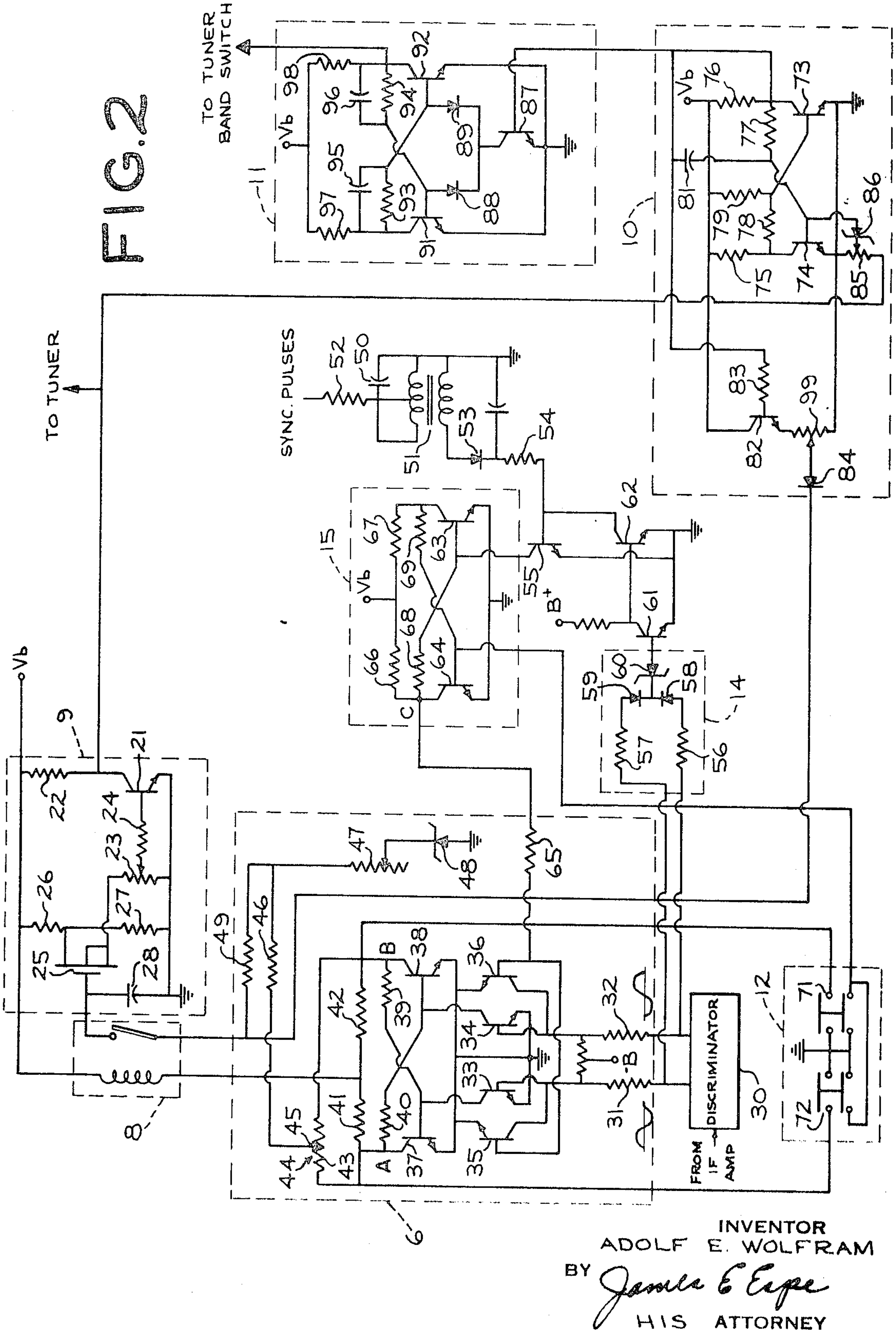
FIG. 2 is a schematic diagram of one embodiment of the invention.

Turning now to FIG. 2, one embodiment of the present invention is shown in greater detail. The voltage drop occuring across a transistor 21 is applied to a voltage-controlled tuner (not shown) to determine the frequencies or channels to be detected by the tuner. A resistor 22 couples the collector of transistor 32 to a source of positive potential $V_b$, the emitter of transistor 21 being connected to ground. The base terminal of transistor 21 is biased through a combination of a potentiometer 23 and a resistor 24. One end of potentiometer 23 is connected to an output terminal of a controlled-impedance device such as field effect transistor (FET) 25. The other output terminal of FET 25 is coupled to a voltage divider comprised of resistors 26 and 27 for providing a proper bias thereto. Capacitor 28 accumulates charge through a switch, herein shown as relay 8, and controls the bias of the gate terminal of FET 25 to vary the current transmitted thereby. The bias upon the base of transistor 21, and thus the voltage applied to the tuner, may thus be considered to be a function of the charge accrued by capacitor 28.

Signals derived from an IF amplifier (not shown) are applied to a discriminator 30 which combines the function of the discriminator 4 and complement generator 5 shown in FIG. 1. Discriminator 30 outputs a pair of opposite polarity error signals whose magnitude is a function of the difference between a sensed component of the IF signal, and predetermined central frequency $f_o$. These signals are applied to the control 6 to initiate the voltage change necessary for the tuner to lock-on the signal received thereby in a manner described in detail in my aforementioned co-pending application. However, for the purpose of completeness in this application, the following description is proferred. The signals from discriminator 30 are applied through decoupling resistors 31 and 32 to the bases of shunting transistors 33 and 34 respectively. Transistors 35 and 36 may be energized by a signal from a reset device to render transistors 33 and 34 inoperative as will be described hereinafter. For purposes of illustration, it will presently be assumed that transistors 35 and 36 are nonconductive. The collector terminals of shunting transistors 33 and 34 are connected to the bases of switching transistors 37 and 38 respectively and, when energized, serve to place either or both of the switching transistors in a nonconductive state. The base of switching transistor 37 is biased by means of a resistor 39 which extends to the collector terminal B of the other switching transistor 38. Similarly, the base of transistor 38 is biased by a resistor 40 which is connected to the collector A of transistor 37. The collectors of transistors 37 and 38 are joined by a pair of series-connected resistors 41 and 42, the junction of these resistors communicating with a source of positive potential $V_b$ by way of the control winding of switching relay 8.

The resistive element 43 of a potentiometer 44 is also coupled between the collector terminals of switching transistors 37 and 38, the slider 45 of the potentiometer being positioned to output a voltage level which reflects the relative state of conduction of transistors 37 and 38. Slider 45 is coupled by means of a resistor 46 to a second potentiometer 47, whose slider is coupled to ground by means of a zener diode 48. A further resistor 49 couples potentiometer 47 to storage capacitor 28 by way of the switch of relay 8.

A resonant circuit comprising a capacitor 50 and transformer 51 is adapted to receive sync pulses from a suitable source by way of resistor 52. Such pulses are transmitted by way of diode 53 and resistor 54 to the base of a switching transistor 55. A positive-going signal occuring at either output terminal of discriminator 30 traverses resistor 56 or 57 and associated diodes 58, 59. If of sufficient magnitude, the signal breaks down zener diode 60 and impinges upon the base terminal of transistor 61 in the manner of an OR logic device. Transistor 61 is then energized to cause a further transistor 62 to cease conduction.

It will now be seen that the combination of transistor 55 and transistors 61 and 62 perform the function of an AND logic device, since it is necessary that a positive-going signal be applied to the base terminals of both transistors 55 and 61 in order that an output signal be produced at the collector of transistor 55. When this occurs, transistor 55 serves to shunt the base of transistor 63 to ground, disabling transistor 63 and lowering the voltage at the collector terminal of transistor 64, indicated as point C. It will be seen that point C communicates with the bases of shunting transistors 35 and 36 by means of resistor 65, transistors 35 and 36 being rendered nonconductive when the voltage at point C drops to a relatively low level. Resistors 66 and 67 apply suitable positive biases to the collectors of transistors 63 and 64, and to the cross-coupled bases thereof by means of resistors 68 and 69.

The base terminal of transistor 64 is coupled to a manual sweep switch 12 such that the base may be grounded when either of contacts 71 and 72 of sweep switch 12 is operated. With its base terminal grounded transistor 64 becomes nonconductive regardless of the state of transistor 63,and the voltage at point C resumes its previous, higher value.

Means for resetting the ramp generator 9, by returning the voltage level of capacitor 28 to a predetermined value, are constituted by reset network 10. This network includes a pair of transistors 73 and 74, the collectors of which are coupled to a source of biasing potential $V_b$ by means of resistors 75 and 76. The bases of transistors 73 and 74 are cross-coupled to the opposite collectors by means of further biasing resistors 77 and 78. The base of transistor 73 further is coupled to a point of biasing potential $V_b$ by means of resistor 79. A capacitor 81 provides AC coupling between the base terminal of transistor 74 and that of transistor 82 by way of coupling resistor 83. Transistor 82 is connected in an emitter-follower arrangement, with potentiometer 99 serving to couple the emitter terminal to a point of ground potential. Diode 84 couples the slider of potentiometer 99 to capacitor 28 by way of the switch of relay 8. A further potentiometer 85 is connected between the output of ramp generator 9 and ground, and is coupled to the base terminal of transistor 74 by zener diode 86.

Means are also provided for causing the voltage-controlled tuner to operate over different predetermined frequency bands. It is contemplated that the tuner is of a type wherein a first frequency band, for instance, the VHF band encompassing channels 2 through 6, would be selected upon the application of a first, lower voltage to a control terminal thereof, while the application of a second, higher voltage would cause the tuner to operate over the frequency band encompassing channels 7 through 13. Bi-stable flip-flop 11 is included in the system to provide this band-selecting capability. Transistor 87 couples the cathodes of diodes 88 and 89 to ground when enabled by a positive voltage derived from the collector of transistor 73. Diodes 88 and 89 are connected to the base terminals of transistors 91 and 92 respectively. The base of each of these transistors is cross-coupled to the collector terminal of the opposite transistor by resistors 93, 94, and capacitors 95, 96 in a manner well known to those skilled in the art. Further biasing resistors 97 and 98 couple the collector terminals of transistors 91 and 92 to a source of biasing potential.

Each time transistor 87 is pulsed "on," flip-flop 11 is unbalanced and whichever of transistors 91 and 92 has previously been conducting is disabled. After transistor 87 again becomes nonconductive, the opposite flip-flop transistor becomes conductive so as to present an opposite-polarity voltage at the collector of transistor 92, and thus to the band selector switch of the tuner.

The operation of the circuit of FIG. 2 will now be discussed. In order to cause capacitor 28 to discharge, thereby effecting an increasing voltage across transistor 21, switch 71 of manual sweep 12 is manually depressed. Depressing switch 71 serves to ground the base terminal of transistor 64 and the collector terminal of switching transistor 38. In order to simplify the description, the junctions formed at the collectors of transistors 37 and 38 will be referred to as points A and B, respectively. Point B is thus brought directly to ground potential through switch 71, while the voltage at point C, the collector terminal of transistor 64, rises to a voltage approximately equal to bias potential $V_b$ after the closure of switch 71 has rendered transistor 64 nonconductive. The positive potential thus derived at point C is applied through resistor 65 to the bases of transistors 35 and 36, rendering them conductive. The now conductive transistors 35 and 36 in turn shunt the base terminals of transistors 33 and 34 to ground, disabling them. Signals produced by discriminator 30, and applied to the bases of transistors 33 and 34 through resistors 31 and 32, now cannot affect the conductivity of the switching transistors 37 and 38, so that points A and B are isolated from the effects of error voltages produced by the discriminator. Point A now attains a relatively high positive potential approximating $V_b$, causing a positive-to-ground voltage drop from A to B to arise across the resistive element 43 of potentiometer 44. It will be assumed that the slider 45 of potentiometer 44 is adjusted to lie closer to point B than point A, with the result that when point B approaches ground potential the voltage upon the slider of potentiometer 44 is lowered. Current flowing through resistor 42 to ground energizes relay 8, connecting capacitor 28 to slider 45 through resistors 46 and 49. The lowered voltage present at slider 45 is applied to capacitor 28, causing the capacitor to discharge until it attains the voltage level of the slider 45 of potentiometer 44.

As the voltage on capacitor 28 declines the conductivity of field effect transistor 25 also decreases, with the result that the voltage drop across potentiometer 23 decreases correspondingly. This produces a decreasing forward bias on the base terminal of transistor 21 with the result that the voltage drop increases thereacross. This increasing voltage drop is applied to the control terminal of the tuner, causing the tuner to scan a frequency band in an upward direction. As the tuner scans through a range of broadcast frequencies, various channels are encountered and corresponding signals are outputted by the tuner to the IF amplifier. As various IF signals are produced, an occasional signal may be produced which, though within an acceptable range about the central frequency $f_o$, is not the desired picture signal. The presence of such an IF signal may, for instance, indicate the detection of an audio subcarrier, due to the presence of the apparently correct IF signal, however, the discriminator 30 produces oppositely phased error voltages and applies them through resistors 31 and 32 to transistors 33 and 34, respectively. If switch 71 is released, the control 6 will tend to "home in" on the received frequency, unless prevented from doing so by a further mechanism. This function of preventing false signal lock-on is supplied by flip-flop 15, which is operated in response to the coincidence of outputs produced by discriminator 30 and by a source of sync pulses in the receiver.

Upon the production of a positive-going signal at either output of discriminator 30, transistor 61 is enabled and serves to disable transistor 62. With transistor 62 disabled, transistor 55 is free to assume a state dictated by the presence or absence of sync pulses at its base terminal. Transistor 55 is normally nonconductive in the absence of sync pulses, with the result that point C at the collector terminal of transistor 64 is maintained at a positive bias $V_b$. This bias is applied by means of resistor 65 to switching transistors 35 and 36 for disabling the control 6 as set forth above.

If the IF signal resulting from mixing the received signal with the tuner scan signal, is in fact a picture carrier, the sync signals present in the carrier will be abstracted by suitable receiver circuitry and applied through resistor 52 to a resonant circuit comprising capacitor 50 and transformer 51. The positive bias derived therefrom traverses diode 53 and energizes transistor 55. As transistor 55 becomes conductive, it shunts the base terminal of transistor 63 to ground and causes the voltage derived at point C to diminish such that transistors 35 and 36 are disabled and cease to inhibit the operation of control 6.

In the same manner, manual sweep switch 12 may be operated to cause the voltage-controlled tuner to sweep through a range of frequencies in the opposite direction. To accomplish this, one need only close the contacts of switch 72, rendering transistor 64 of flip-flop 15 nonconductive and thus inhibiting the operation of control 6 by energizing transistors 35 and 36. At the same time, point A, and thus the left-hand side of potentiometer 44, is brought to ground potential while point B at the right-hand side of the potentiometer rises to a voltage approximately that of the full biasing potential $V_b$. As before, current drawn through resistor 41 energizes relay 8 and causes its switch to close. The higher voltage now applied to the slider 45 of potentiometer is limited by means of potentiometer 47 and zener diode 48 such that a predetermined maximum potential is applied through the switch of relay 8 to capacitor 28. The new, higher potential causes capacitor 28 to charge, eventuating in a progressively decreasing voltage drop across transistor 21 which in turn effects a reversed scanning direction by the tuner. When received signals are encountered during the reverse-direction scan, discriminator 30 and the sync pulse sensing network combine to allow the signal seeking process to commence upon the reopening of switch 72.

While the operation of the system so far described provides both a signal-seeking and a scanning capability over a single frequency band, it will be appreciated by those skilled in the art that the frequency spectra within which channels allocated for television transmission are grouped comprise at least two discrete bands. A first, lower band encompasses channels 2 through 6, and a second, higher band encompasses those channels above channel 7. Often the channels above channel 13 are regarded as being in a separate frequency band, this band being designated UHF, while those channels beneath channel 14 are designated VHF. It would therefore be highly desirable to cause a voltage controlled tuner to operate in different modes in order to be able to use a common terminal for controlling tuner operation over more than one frequency band. For this reason, the present system further includes means for causing the tuner to automatically operate over a second frequency band when a first band has been scanned, and for cycling the ramp generator from one end of its operating range to the other so that the newly selected frequency band may be scanned in the same direction as the band already traversed. In order to accomplish this, reset circuit 10 and band switch flip-flop 11 are included in the system.

Reset 10 is coupled to the output terminal of ramp generator 9 and monitors the voltage applied to the tuner. When the voltage outputted by the ramp generator exceeds some maximum value, corresponding to that voltage which causes the tuner to scan to the end of a frequency band, zener diode 86 breaks down and forward-biases transistor 74. As transistor 74 becomes conductive, the biasing potential applied to the base of transistor 73 is reduced so that transistor 73 ceases to conduct. The positive voltage which now appears at the collector terminal of transistor 73 is applied to the base of transistor 82 by means of transistor 83. The increased voltage energizes transistor 82 which applies a positive bias to the top end of potentiometer 99, forward-biasing diode 84 and applying a relatively high positive voltage to capacitor 28. The relatively low output impedance of the reset circuit 10 allows capacitor 28 to charge rapidly so that it is quickly placed in condition for repeating another scanning operation. The heightened voltage occurring at the collector of transistor 73 which is applied to the base of transistor 82 is also applied to the base of transistor 87 of the band selector flip-flop 11. Transistors 82 and 87 are pulsed on for a short period of time, the period of conduction being determined by the relative magnitudes of capacitor 81 and resistor 77. The period of conduction, however, is long enough to unbalance the flip-flop circuit and cause the states of transistors 91 and 92 to reverse.

It will be seen that if transistor 92 is conducting before a pulse is applied to the base of transistor 87, a low voltage would be communicated to the tuner band switch from the collector terminal of transistor 92. After transistor 87 has been pulsed on, however, transistor 91 begins to conduct and transistor 92 is disabled. When transistor 92 ceases to conduct, the collector terminal thereof attains a positive potential which approximates that of the biasing source. The collector terminal of transistor 92 thus applies an increased voltage to the tuner band switch for causing the tuner to select a second frequency band to be scanned.

The mechanism so far described combines with the signal seeking and scanning network to produce a system with the capability of automatically recycling a scanning device and simultaneously electing a new frequency band to be scanned. The network, nontheless, maintains the capability of bi-directional scanning within any given band only until the upper end of the band is exceeded, at which point the scanning process begins again at the lower end of the band. This may be referred to as a bi-directional scan system having a unidirectional reset.

Figure 3:
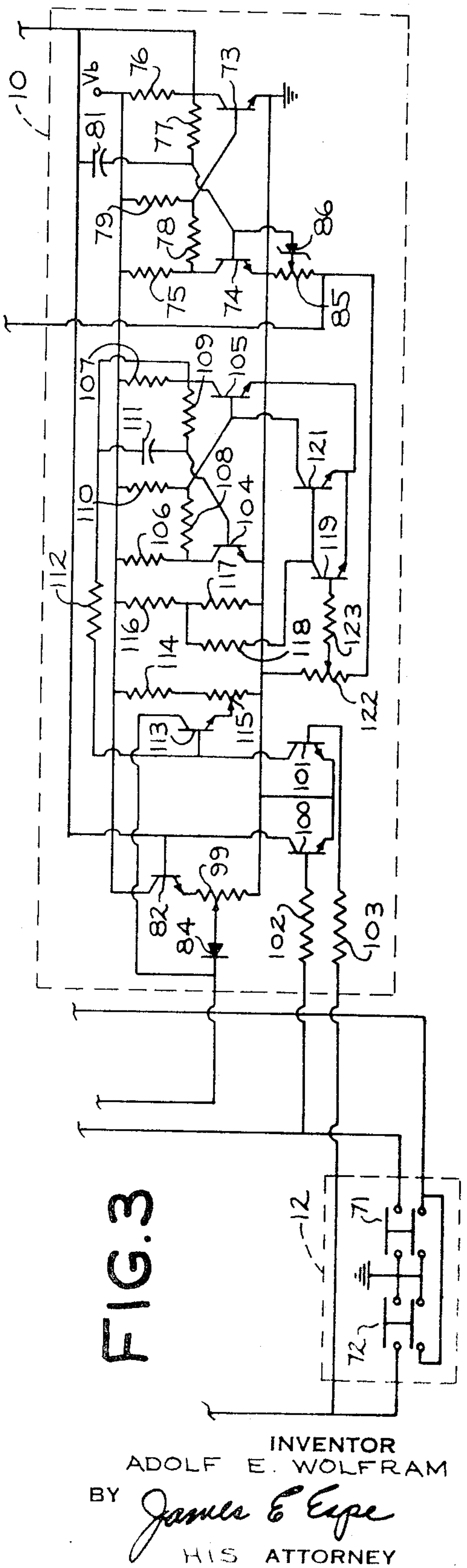
FIG. 3 is a schematic drawing of an alternate embodiment of the invention.

FIG. 3 shows a further embodiment of the present invention wherein a bi-directional reset capability is provided in addition to the system described with respect to the embodiment of FIG. 2. It will be seen that the reset network 10 has been extensively modified in order to provide the desired function.

A pair of switching transistors 100 and 101 have their base terminals coupled to contacts of switches 71 and 72 of manual sweep 12 by means of resistors 102 and 103, respectively. Transistors 104 and 105 are coupled between a source of DC biasing potential $V_b$ and ground by means of resistors 106 and 107. The bases of transistors 104 and 105 are cross-coupled in a collector-follower arrangement by means of resistors 108 and 109. Resistor 110 couples the base terminal of transistor 105 to the source of biasing potential $V_b$, while capacitor 111 couples the base of transistor 104 to the collector of transistor 101 by means of resistor 112. The collector terminal of transistor 101 is also operatively connected to the base of transistor 113. A voltage divider comprising resistor 114 and the resistive element of potentiometer 115 serves to provide a predetermined DC potential to the emitter terminal of transistor 113. A voltage divider comprising resistors 116 and 117 are connected between a source of biasing potential and ground, with a further resistor 118 serving to couple the junction of resistors 116 and 117 to the collector terminal of transistor 119 and to the base of transistor 121, the collector-emitter circuit of transistor 121 serving to shunt the base terminal of transistor 105 to the emitter thereof. Potentiometer 122 provides a biasing potential to the base of transistor 119 by means of resistor 123.

The operation of the modified reset network 10 will now be described. When it is desired to cause the tuner to scan in a downward sense, switch 72 is depressed for initiating the controlled charging of capacitor 28. The closure of switch 72, in addition to lowering the voltage at point A (FIG. 1) to ground potential, also lowers the voltage at the base of transistor 101 to cause transistor 101 to become nonconducting. As capacitor 28 accumulates charge, supporting a continuously increasing voltage, the voltage outputted to the tuner, and thus the voltage applied to potentiometers 85 and 122, decreases. When the tuner control voltage has fallen to a predetermined minimum, the value of which is determined by the adjustment of potentiometer 122, insufficient potential exists at the base of transistor 119 to maintain conduction thereof. Transistor 119 then ceases to conduct, allowing transistor 121 to be energized by means of a bias potential derived through resistors 116 and 118. Transistor 121 serves to shunt the base terminal of transistor 105 to the emitter thereof, disabling it and causing the voltage at the collector terminal thereof rise rapidly. The nature and duration of this rising voltage, or pulse, is determined by the relative size of capacitor 111 and associated resistors. The positive-going voltage pulse is applied to the base of transistor 113, causing it to conduct. Since switch 71 is open, it will be understood that transistor 100 is biased into conduction and prevents retrace transistors 82 from conducting during the described operation.

When transistor 113 is energized it couples capacitor 28 through relay 8 to the slider of potentiometer 115, which is adjusted to a voltage level which is substantially the same as the minimum voltage achieved by capacitor 28 at the termination of an upward scan. Due to the relatively low resistivity of the circuit constituted by the emitter-collector circuit of transistor 113 and potentiometer 115, capacitor 28 is discharged rapidly therethrough. It is then ready to begin charging and thus to institute a new, downwardly directed scan.

As was the case in the embodiment of FIG. 2, in order to obtain an oppositely directed scan it is only necessary to close switch 71. Upon the production of a predetermined, maximum voltage by range generator 9, corresponding to a discharged condition of capacitor 28, transistor 82 is enabled in order to recharge the capacitor and recycle the scanning.

It will thus be seen that the present invention affords means for sweeping through a range of frequencies, and for automatically "locking" upon a desired signal. Further, the disclosed system is capable of automatically recycling when either extreme of its operating range is obtained.

As will be evident from the foregoing description, certain aspects of the invention are not limited to the particular details of construction of the examples illustrated, and it is there contemplated that other modifications or applications will occur to those skilled in the art. It is therefore intended that the appended claims shall cover such modifications and applications as do not depart from the true spirit and scope of the invention.

I claim:

1. In a television receiver including a voltage-controlled tuner for producing an IF signal in response to a received signal, means for operating said voltage-controlled tuner comprising:

discriminator means responsive to said IF signal for producing an error indication when said IF signal deviates from a desired frequency, control means responsive to said error indication to produce a first control voltage when said IF signal is lower than said desired frequency and a second control voltage when said IF signal is higher than said desired frequency, voltage generating means applying a changing voltage to said tuner in response to said first or second control voltage to cause said tuner to lock-on to a received signal when the IF signal produced thereby corresponds to said desired frequency, and scan initiation means connected to said control means when activated to inhibit said control means from responding to said error indication and selectively causing said control means to produce one of said first and second control voltages so long as said scan initiation means is activated to cause said tuner to sweep through a spectrum of frequencies.

2. The invention as defined in claim 1, further including means responsive to said error indication and to sync signals derived within said television receiver for enabling said control means to respond to said error indication only when a video IF carrier is produced by said tuner.

3. The invention as defined in claim 1, further including reset means responsive to said changing voltage reaching one end of its range to reset said voltage generating means to the opposite end of its range, and band switching means coupled to said reset means to change the band of frequencies scanned by said tuner when said changing voltage is reset.

* * * * *